United States Patent [19]

Hofmann

[11] Patent Number: 4,745,409

[45] Date of Patent: May 17, 1988

[54] BROADBAND SIGNAL SPACE SWITCHING DEVICE

[75] Inventor: Rüdiger Hofmann, Gilching, Fed. Rep. of Germany

[73] Assignee: Siemens Aktiengesellschaft, Berlin and Munich, Fed. Rep. of Germany

[21] Appl. No.: 919,700

[22] Filed: Oct. 16, 1986

[30] Foreign Application Priority Data

Oct. 28, 1985 [DE] Fed. Rep. of Germany ....... 3538319

[51] Int. Cl.$^4$ .......................... H04Q 9/00; H04Q 3/52
[52] U.S. Cl. ............................. 340/825.870; 379/292; 307/241
[58] Field of Search ...................... 340/825.87, 825.91; 379/292; 370/58, 59, 64; 307/272 A, 241, 481, 576, 585, 571

[56] References Cited

U.S. PATENT DOCUMENTS

| 3,618,024 | 11/1971 | Leger et al. | 340/825.91 |
| 3,832,495 | 8/1974 | Hovagimyan et al. | 379/292 |
| 3,980,831 | 9/1976 | Mertel | 379/54 |
| 4,156,153 | 5/1979 | Szechenyi | 379/292 |
| 4,446,552 | 5/1985 | Tweedy | 370/58 |

OTHER PUBLICATIONS

Pfannschmidt, "Arbeitsgeschwindigkeitsgrenzen von Koppelnetzwerken für Breitband-Digitalsignale", Dissertation, Braunschweig 1978, pp. 120-125.
ISS '84 Conference Papers 23C1, p. 7, (FIG. 9), May 1984.
ISS '84 Conference Papers 31C3, pp. 1-6, May 1984, C. Duret et al., Integrated Crosspoint Technology for Wideband Space Division Switching Networks".

Primary Examiner—Donald J. Yusko
Attorney, Agent, or Firm—Hill, Van Santen, Steadman & Simpson

[57] ABSTRACT

In a broadband signal space switching device, the respective switching elements are controllable by a decoder-controlled, crosspoint-associated memory cell and are respectively formed with a CMOS inverter circuit having MOS transistors of the enhancement type which lie between a switching element input and a switching element output. A further p-channel transistor, likewise of the enhancement type, is inserted between the p-channel enhancement transistor and the appertaining feed voltage source and a further n-channel transistor, likewise of the enhancement type, is inserted between the n-channel enhancement transistor and the appertaining feed voltage source. The control electrodes of the further enhancement transistors are connected to the outputs of the memory cell.

1 Claim, 2 Drawing Sheets

BROADBAND SIGNAL SPACE SWITCHING DEVICE

BACKGROUND OF THE INVENTION

1. Field of the Invention

The present invention relates to a telecommunications systems and in particular to a broadband signal space switching device having crosspoints comprising respective switching elements which are controllable by a decoder-controlled, crosspoint-associated memory cell.

2. Description of the Prior Art

Recent developments in telecommunications technology have led to service-integrated communications transmission and switching systems for narrowband and broadband communications services which provide light waveguides as the transmission media in the area of the subscriber lines by a way of which both the narrowband communications services such as, in particular, 64-kbit/s digital telephony and broadband communications services such as, in particular, 140 Mbit/s picture telephony are conducted, whereby, however, narrowband signal switching devices and broadband signal switching devices (preferably having shared control devices) are provided in juxtaposition in the switching stations. In this connection one may refer to the German Patent No. 24 21 002.

It is known in the context of a broadband signal time-division multiplex switching device whose crosspoints are respectively used in time-division multiplex for a plurality of connections, to connect two respective lines with the assistance of a gate which is switched on and off by a crosspoint-associated memory cell constructed of a bistable D-flip-flop. The crosspoint-associated memory cell, whose clock input is supplied with a corresponding clock signal, being driven in only one coordinate direction, in particular, at its D-input (Pfannschmidt, "Arbeitsgeschwindigkeitsgrenzen von Koppelnetzwerken für Breitband-Digitalsignales", Dissertation, Braunschweig 1978, FIG. 6.7). In view of a time-division multiplex factor of about 4-8 attainable given the bit rate of 140 Mbit/s and in view of the involved circuit technology of required, however, pure space switching devices are presently preferred for switching broadband signals, the connections extended via the individual crosspoints being only spatially separated from one another.

A pure broadband signal space switching arrangement can be constructed of the crosspoint matrix in whose crosspoints the switching elements are respectively controlled by a crosspoint-associated holding memory cell that is only decoder-controlled (Pfannschmidt, op. cit. FIG. 6.4). The switching elements can thereby be respectively constructed as complementary metal-oxide-semiconductor (CMOS) transfer gates (CMOS transmission gates) (ISS'84 Conference Papers 23Cl, FIG. 9). The utilization of the simple CMOS transfer gate as a switching element, however, involves a load of its input line by the capacitance of its output line in the through-connected condition of the CMOS transfer gate, and this condition can cause signal delays. As a result of what are referred to as under-threshold effects (for example, in the form of stray currents or under-threshold currents) along the MOS transistors, however, crosstalk phenomena can occur at the switching elements that are actually located in the inhibited condition.

A similar case is also true of a broadband space switching device comprising crosspoints having switching elements respectively controllable by a crosspoint-associated memory cell, these switching elements being respectively formed with a CMOS inverter circuit comprising MOS transistors of the enhancement type which has its input side connected to the appertaining signal input line and has its output side leading to the appertaining signal output line, a p-channel depletion transistor having its control electrode connected to the output of the memory cell being inserted between the p-channel enhancement transistor and the appertaining feed voltage source and an n-channel depletion transistor having its control electrode connected to the complementary output of the memory cell being inserted between the n-channel enhancement transistor and the appertaining feed voltage source (ISS'84 Conference Papers 31C3, FIG. 14). As a consequence of a constant, at least weak conductivity of the two depletion transistors, such a construction of the switching elements leads to static dissipated power of a crosspoint, even in its inhibited condition, and also leads to the fact that the switching element in the through-connected condition is also loaded by switching elements which are in the inhibited condition and which are nonetheless weakly conductive. Furthermore, no full signal swings between the two values of feed potential are possible.

SUMMARY OF THE INVENTION

The object of the present invention, is to provide an advantageous construction of the switching elements wherein the disadvantages cited above are avoided.

The invention relates to a broadband space switching device having crosspoints comprising switching elements respectively controllable by a decoder-controlled, crosspoints-associated memory cell. The switching elements are respectively formed with a CMOS inverter circuit having MOS transistors of the enhancement type which has its input side connected to the appertaining signal input line and its output side connected to the appertaining signal output line and between whose MOS transistor of the one channel type and the appertaining feed voltage source an MOS transistor, likewise of the one channel type, having its control electrode connected to the output of the memory cell, is inserted and between whose MOS transistor of the other channel type and the appertaining feed voltage source, an MOS transistor, likewise of the other channel type, having its control electrode connected to the complementary output of the memory cell, is inserted in series. This broadband signal space switching device is characterized, according to the present invention, in that a p-channel transistor of the enhancement type is inserted between the p-channel enhancement transistor and the appertaining feed voltage source and an n-channel transistor of the enhancement type is inserted between the n-channel enhancement transistor and the appertaining feed voltage source.

In addition to the advantage of a complete decoupling of output and input lines and the consequent elimination of crosstalk problems, as well as avoidance of dissipated power in switching elements which are in the inhibited condition, the present invention provides the further advantage of a high working speed since, first of all, reactions of the output line capacitance onto the input line are avoided, and, second, the inverter circuit, acting as a driver buffer for the output line, noticeably increases the edge steepness of the through-connected signals. At the same time, the signals can be through-connected with the full swings between the two values of feed potential.

BRIEF DESCRIPTION OF THE DRAWINGS

Other objects, features and advantages of the invention, its organization, construction and operation, would be best understood from the following detailed description, taken in conjunction with the accompanying drawings, on which.

DESCRIPTION OF THE PREFERRED EMBODIMENTS

Figure 1:
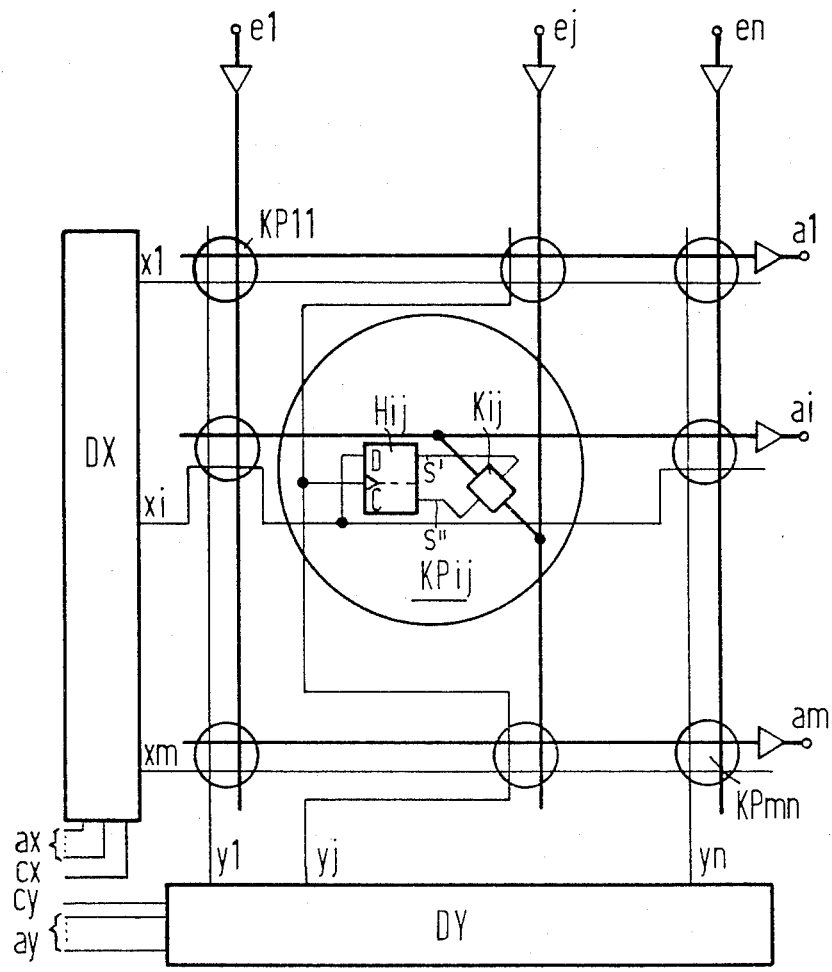
FIG. 1 is a schematic circuit diagram of an exemplary embodiment of a broadband switching matrix network.

Referring to FIG. 1, the schematic representation set forth a broadband signal space switching device in the scope necessary for an understanding of the invention. The space switching device comprises a crosspoint matrix having crosspoints KPll . . . KPij . . . KPmn whose switching elements are respectively controlled by a crosspoint-associated holding memory cell Hij (at the crosspoint KPij), as shown in greater detail at the crosspoint KPij for the switching element Kij thereof. The holding memory cell Hij (at the crosspoint KPij) is formed by a bistable D-flipflop whose two outputs s' and s'' are connected to corresponding control inputs of the respective switching element (Kij in the crosspoint KPij).

The holding memory cells Hij are, in turn, selected in two coordinates by two selection decoders, in particular, a row decoder DX and a column decoder DY, being selected via corresponding selection lines xl . . . xi . . . xm; yl . . . yj . . . yn. The decoder DX selects in the row direction and has its respective decoder outputs . . . xi connected to the D-inputs of the D-flipflops . . . Hij . . . arranged in the appertaining matrix row, in the i$^{th}$ row in the present example, whereas the decoder DY selects in the column direction and has its respective decoder outputs . . . yj . . . connected to the clock inputs C of the D-flipflops . . . Hij . . . arranged in the appertaining matrix column, for example, in the j$^{th}$ column.

As may be seen from FIG. 1, the two selection decoders DX,DY may be chargeable via input lines ax,ay with a respective crosspoint row or crosspoint column address shared by a matrix line (row or column) of crosspoints and may be chargeable via input lines cx,cy with a respective address clock signal in response to which they respectively emit a selection signal in due time to the selection line corresponding to the respective crosspoint line address.

The coincidence of a row selection signal and of a column selection signal at the intersection of the appertaining matrix row with the appertaining matrix column in the establishment of a corresponding connection then effects an activation of the holding memory cell located at the crosspoint, for example, of the holding memory cell Hij, with the result that the switching element, the switching element Kij in the present example, controlled by the appertaining holding memory cell Hij becomes conductive.

In order for the switching element Kij considered in the present example to be inhibited, in turn, given a cleardown of the appertaining connection, the emission of only a corresponding column selection signal by the column decoder DY via its selection line yj suffices, without the row decoder DX emitting a selection signal via its row selection line xi. The control signal then appearing only at the clock input C of the holding memory cell Hij belonging to the crosspoint KPij then effects the resetting of the holding memory cell Hij, with the result that the switching element Kij controlled thereby is inhibited.

At their respective outputs s', it is assumed that the individual holding memory cell . . . Hij . . . respectively output a signal $U_{DD}$ corresponding to the one feed potential $U_{DD}$ (+5V) of CMOS circuits or a signal $U_{SS}$ corresponding to the other feed potential $U_{SS}$ (ground) of CMOS circuits and emit the respectively other signal at their output s''. Further details of the circuit-oriented realization of the holding memory cells Hij need not be discussed in further detail here since the same is not necessary for an understanding of the invention. Such details, moreover, have already been set forth in the German Patent Application No. P 35 33 915.2.

Figure 2:
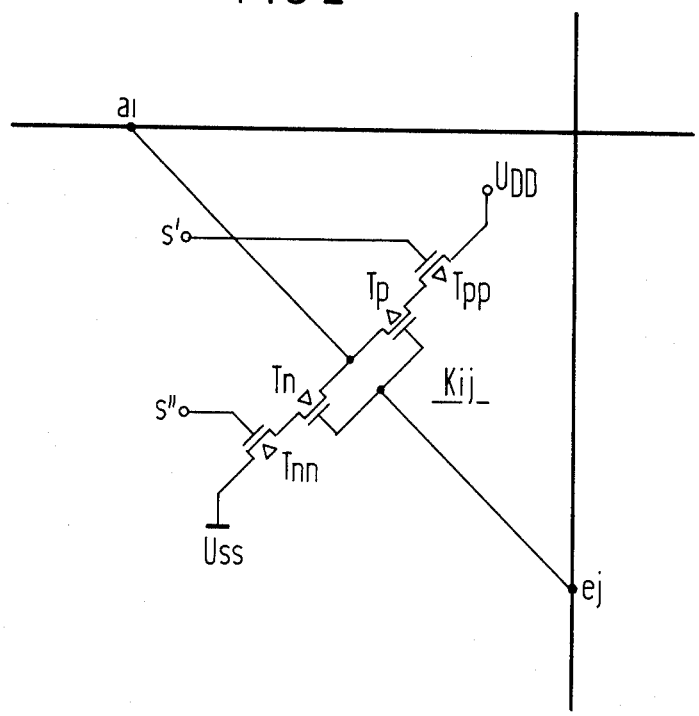
FIG. 2 is a schematic circuit diagram of the details of the circuit-oriented realization of a crosspoint matrix constructed in accordance with the present invention.

FIG. 2 illustrates details of the circuit-oriented construction of the switching elements Kij. In accordance with FIG. 2, such a switching element Kij is formed with a CMOS inverter circuit having MOS transistors Tp,Tn of the enhancement type which has its input side connected to the signal input line ej and has its output side connected to the appertaining signal output line ai. The MOS enhancement transistors in FIG. 2 are symbolized, for example, by a graphic symbol employed in Weiss, Horninger: Integrierte MOS-Schaltungen, Springer-Verlag, Berlin-Heidelberg-New York, 1982, as well as in the aforementioned ISS'84 Conference Papers 31C3, whereby the respective channel type is indicated by a triangular arrow. A p-channel transistor Tpp of the enhancement type which has its control electrode connected to the output s' of the holding memory cell Hij (in FIG. 1) is inserted between the p-channel enhancement transistor Tp and the appertaining feed voltage source $U_{DD}$ and an n-channel transistor Tnn of the enhancement type which has its control electrode connected to the complementary output s'' of the holding memory cell Hij (FIG. 1) is inserted between the n-channel enhancement transistor Tn and the appertaining feed voltage source $U_{SS}$ (ground).

When, proceeding from the holding memory cell Hij (FIG. 1), the potential $U_{SS}$ is connected to the control input s' of the switching element Kij and the potential $U_{DD}$ is connected to the control input s'', then the switching element Kij is in the through-connected condition. Digital signals appearing at the input ej therefore proceed to the output ai, inverted and amplified in the CMOS inverter Tp,Tn, whereby a reaction from the output ai onto the input ej is suppressed at the same time due to the CMOS inverter Tp,Tn.

When, proceeding from the holding memory cell Hij (FIG. 1), the potential $U_{DD}$ is connected to the control input s' of the switching element Kij and the potential $U_{SS}$ is connected to the control input s'', then the switching element Kij is in its inhibited condition (tri-state condition), so that no signals appearing at the input ej proceed to the output ai. At the same time the CMOS inverter circuits or tne switching elements of the crosspoint matrix KPll . . . KPij . . . KPmn (FIG. 1) that are in their inhibited condition (tri-state condition) suppress crosstalk between the output lines al ... ai ... am (FIG. 1) and the input lines el ... ej ... en (FIG. 1) via such inhibited crosspoints.

Although I have described my invention by reference to a particular illustrated embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a broadband signal space switching device in which a plurality of crosspoints are arranged in a matrix of columns and rows formed by input lines and output lines, in which the crosspoints each include a decoder-controlled bistable memory cell having complementary outputs, in which each crosspoint comprises a complementary metal-oxide-semiconductor inverter including an input connected to a respective input line, an output connected to a respective output line, a first MOS transistor connected to a first feed potential, a second MOS transistor connected between said first MOS transistor and a second feed potential, and in which each of said first and second MOS transistors comprises a gate connected to a respective input line, and in which the junction of the first and second transistors is connected to the respective output line, and in which the first transistor is a p-channel transistor of the enhancement type and said second transistor is an n-channel transistor of the enhancement type, the improvement comprising:

a p-channel third transistor of the enhancement type connected between said first transistor and the respective feed potential; and an n-channel fourth transistor of the enhancement type connected between said n-channel second transistor and the appertaining feed voltage, each of said third and fourth transistors comprising a gate connected to a respective complementary output of the respective memory cell.

* * * * *